(12) United States Patent
Wu et al.

(10) Patent No.: US 10,289,892 B2
(45) Date of Patent: May 14, 2019

(54) FINGERPRINT CHIP PACKAGE STRUCTURE AND TERMINAL

(71) Applicant: GUANGDONG OPPO MOBILE TELECOMMUNICATIONS CORP., LTD., Dongguan, Guangdong (CN)

(72) Inventors: Shoukuan Wu, Guangdong (CN); Zanjian Zeng, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/974,789

(22) Filed: May 9, 2018

(65) Prior Publication Data

US 2018/0260606 A1    Sep. 13, 2018

Related U.S. Application Data

(63) Continuation of application No. 15/627,733, filed on Jun. 20, 2017.

(30) Foreign Application Priority Data

Aug. 16, 2016 (CN) .......................... 2016 1 0675148
Aug. 16, 2016 (CN) ..................... 2016 2 0889023 U

(51) Int. Cl.
  *G06F 1/16* (2006.01)
  *G06K 9/00* (2006.01)
  (Continued)

(52) U.S. Cl.
  CPC ....... *G06K 9/00053* (2013.01); *G06F 1/1637* (2013.01); *G06F 1/1684* (2013.01);
  (Continued)

(58) Field of Classification Search
  CPC ...................................................... H01L 23/10
  See application file for complete search history.

(56) References Cited

U.S. PATENT DOCUMENTS

| 8,717,775 B1* | 5/2014 | Bologna ........... G06K 9/00053 361/761 |
|---|---|---|
| 2010/0176476 A1* | 7/2010 | Takayama ............ B26D 1/0006 257/432 |
| 2015/0071509 A1* | 3/2015 | Myers ................... G06K 9/0002 382/124 |

FOREIGN PATENT DOCUMENTS

| CN | 104156710 A | 11/2014 |
| CN | 105095861 A | 11/2015 |
| CN | 105825165 A | 8/2016 |

OTHER PUBLICATIONS

Chinese Patent Application No. 201610675148.4, First Office Action dated Jun. 5, 2017, 6 pages.
(Continued)

*Primary Examiner* — William A Harriston
(74) *Attorney, Agent, or Firm* — Lathrop Gage LLP

(57) ABSTRACT

The present disclosure provides a fingerprint chip package structure and a terminal. The fingerprint chip package structure includes a package body and a fingerprint identification chip. The package body includes a bottom surface and a lateral surface connected to the bottom surface, and defines a recessed portion at a junction of the bottom surface and the lateral surface. The fingerprint identification chip is received in the package body. The package body packages the fingerprint identification chip therein. The package body includes a first package portion and a second package portion coupled to the first package portion. The first package portion includes the bottom surface, and the second
(Continued)

package portion includes the lateral surface. The fingerprint chip package structure is configured to be received in a decoration enclosure.

18 Claims, 5 Drawing Sheets

(51) Int. Cl.
*H04M 1/02* (2006.01)
*H04M 1/18* (2006.01)
*H05K 1/11* (2006.01)
*H01L 23/00* (2006.01)
*H01L 23/10* (2006.01)
*G06F 3/0354* (2013.01)

(52) U.S. Cl.
CPC .......... *G06F 3/03547* (2013.01); *H01L 23/10* (2013.01); *H01L 24/06* (2013.01); *H04M 1/0202* (2013.01); *H04M 1/026* (2013.01); *H04M 1/18* (2013.01); *H05K 1/11* (2013.01); *G06F 2203/0338* (2013.01)

(56) References Cited

OTHER PUBLICATIONS

Chinese Patent Application No. 201610675148.4, English translation of the First Office Action dated Jun. 5, 2017, 6 pages.
Chinese Patent Application No. 201610675148.4, Second Office Action dated Aug. 8, 2017, 4 pages.
Chinese Patent Application No. 201610675148.4, English translation of the Second Office Action dated Aug. 8, 2017, 6 pages.
Chinese Patent Application No. 201610675148.4, Third Office Action dated Oct. 16, 2017, 3 pages.
Chinese Patent Application No. 201610675148.4, English translation of the Third Office Action dated Oct. 16, 2017, 4 pages.
Chinese Patent Application No. 201610675148.4, Notification to Grant Patent Right for Invention dated Nov. 29, 2017, 1 page.
Chinese Patent Application No. 201610675148.4, English translation of the Notification to Grant Patent Right for Invention dated Nov. 29, 2017, 2 pages.
Chinese Patent Application No. 201610675148.4, English translation of the Allowed Claims as of Nov. 29, 2017, 2 pages.
European Patent Application No. 17178047.1, Office Action dated Jan. 16, 2019, 9 pages.

* cited by examiner

FINGERPRINT CHIP PACKAGE STRUCTURE AND TERMINAL

CROSS-REFERENCE TO RELATED APPLICATIONS

This application is a Continuation Application of U.S. application Ser. No. 15/627,733, filed Jun. 20, 2017, which is based on and claims priority to Chinese Patent Application Serial Nos. 201610675148.4 and 201620889023.7, filed on Aug. 16, 2016, the entire contents of which are incorporated herein by reference.

FIELD

The present disclosure relates to a field of terminals, and more particularly to a fingerprint chip package structure and a terminal.

BACKGROUND

In the related art, some mobile phones include a fingerprint chip package structure and a decoration ring, and the fingerprint chip package structure is received in the decoration ring. The fingerprint chip package structure includes a fingerprint identification chip and a package body for packaging the fingerprint identification chip. However, at present, a configuration of the fingerprint chip package structure is adverse to positioning and mounting the fingerprint chip package structure in the decoration ring, thus resulting in a low assembling efficiency of the fingerprint chip package structure.

SUMMARY

According to a first aspect of embodiments of the present disclosure, there is provided a fingerprint chip package structure. The fingerprint chip package structure includes a package body and a fingerprint identification chip. The package body includes a bottom surface and a lateral surface connected to the bottom surface, and defines a recessed portion at a junction of the bottom surface and the lateral surface. The fingerprint identification chip is received in the package body. The package body packages the fingerprint identification chip therein. The package body includes a first package portion and a second package portion coupled to the first package portion. The first package portion includes the bottom surface, and the second package portion includes the lateral surface. The fingerprint chip package structure is configured to be received in a decoration enclosure, and the decoration enclosure includes a decoration ring and a support rim extending inwards from an inner wall of the decoration ring. The support rim is received in the recessed portion, the support rim has a hole therein, the first package portion passes through the hole in the support rim, and the second package portion is supported on the support rim.

According to a second aspect of embodiments of the present disclosure, there is provided a terminal. The terminal includes a fingerprint chip package structure. The fingerprint chip package structure includes a package body and a fingerprint identification chip. The package body includes a bottom surface and a lateral surface connected to the bottom surface, and defines a recessed portion at a junction of the bottom surface and the lateral surface. The fingerprint identification chip is received in the package body. The package body packages the fingerprint identification chip therein. The package body includes a first package portion and a second package portion coupled to the first package portion. The first package portion includes the bottom surface, and the second package portion includes the lateral surface. The fingerprint chip package structure is configured to be received in a decoration enclosure, and the decoration enclosure includes a decoration ring and a support rim extending inwards from an inner wall of the decoration ring. The support rim is received in the recessed portion, the support rim has a hole therein, the first package portion passes through the hole in the support rim, and the second package portion is supported on the support rim.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and/or other aspects and advantages of embodiments of the present disclosure will become apparent and more readily appreciated from the following descriptions made with reference to the drawings.

DETAILED DESCRIPTION

Figure 1:
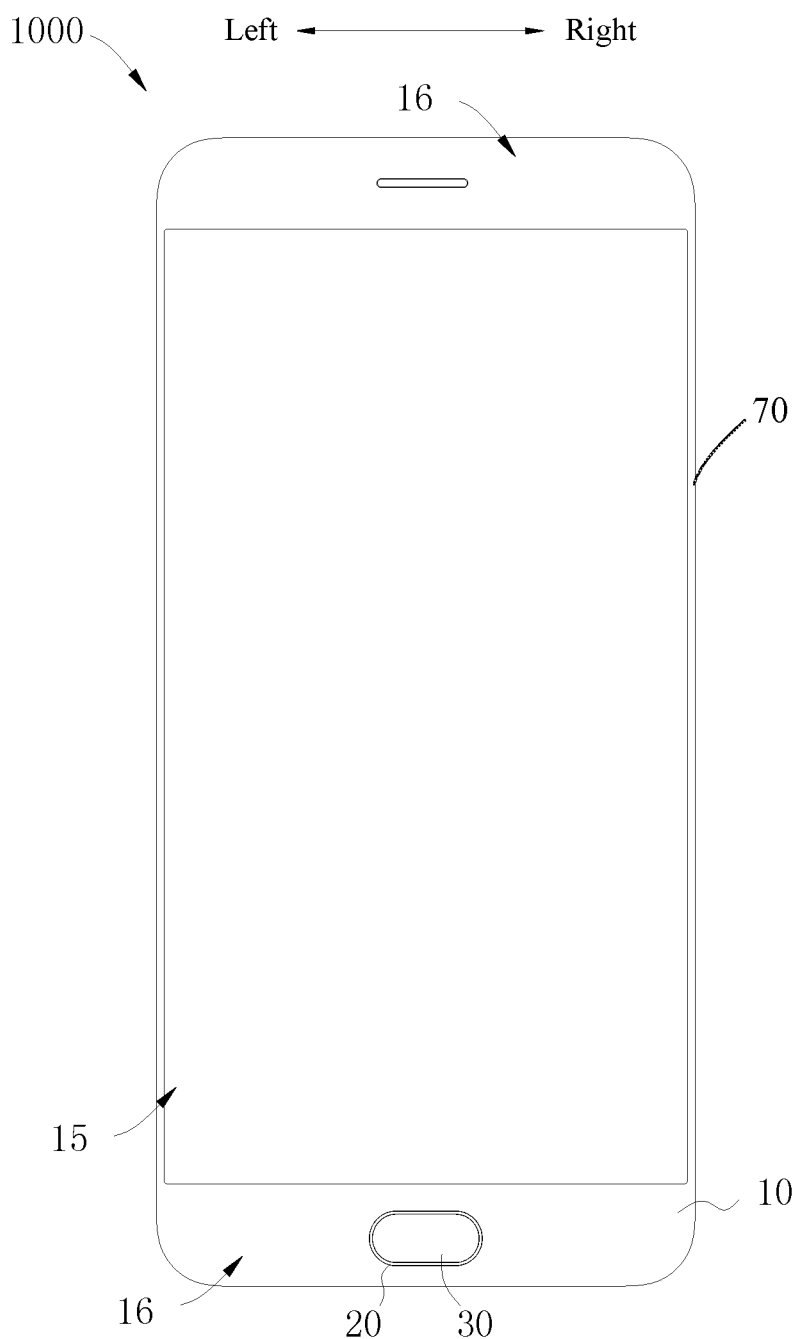
FIG. 1 is a plan view of a terminal according to embodiments of the present disclosure.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In the specification, it is to be understood that terms such as "central", "longitudinal", "lateral", "length", "width", "thickness", "upper", "lower", "front", "rear", "left", "right", "vertical", "horizontal", "top", "bottom", "inner", "outer", "clockwise" and "counterclockwise" should be construed to refer to the orientation as then described or as shown in the drawings under discussion. These relative terms are for convenience of description and do not require that the present disclosure be constructed or operated in a particular orientation. In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, the terms "mounted", "connected", "coupled", "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on", "above" or "on top of" a second feature may include an embodiment in which the first feature is right or obliquely "on", "above" or "on top of" the second feature, or just means that the first feature is at a height higher than that of the second feature; while a first feature "below", "under" or "on bottom of" a second feature may include an embodiment in which the first feature is right or obliquely "below", "under" or "on bottom of" the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Figure 2:
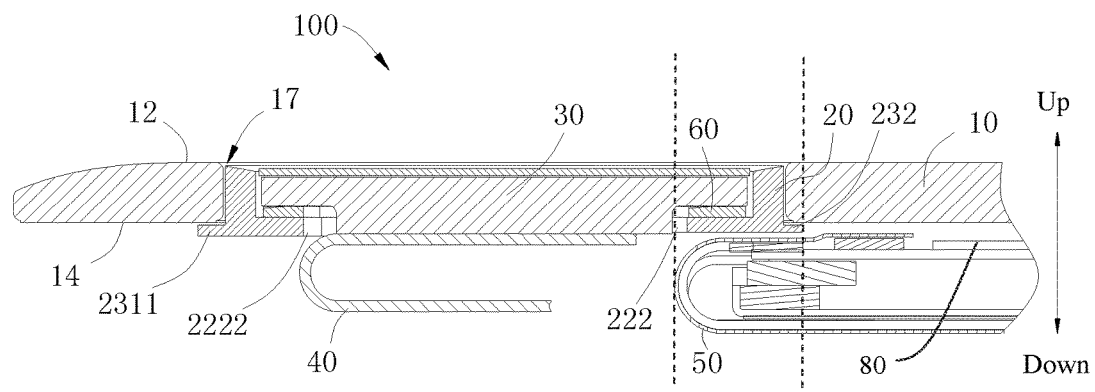
FIG. 2 is a sectional view of an input assembly according to embodiments of the present disclosure.

As illustrated FIG. 1 and FIG. 2, an input assembly 100 according to embodiments of the present disclosure includes a touch panel 10, a decoration enclosure 20 and a fingerprint chip package structure 30.

The input assembly 100 according to embodiments of the present disclosure can be applied to a terminal 1000, and the terminal 1000 can be configured as an electronic device such as a mobile phone or a tablet. It may be understood that, the terminal 1000 includes but is not limited to examples in the present embodiment. In some embodiments, the terminal 1000 can include a screen 80 configured to display content and a shell 70 configured to enclose the screen 80.

In some embodiments, the touch panel 10 is also received in the shell 70 and located above the screen 80. The touch panel 10 includes an upper surface 12 and a lower surface 14, as shown in FIG. 2. The upper surface 12 is opposite to the lower surface 14. It may be understood that, the upper surface 12 of the touch panel 10 is a facade of the input assembly 100, facing to a user. The user can make gesture operations (for example clicking or sliding) on the upper surface 12, so as to control the terminal 1000 to achieve corresponding functions.

The touch panel 10 can be made of light-transparent materials, such as glasses, ceramics or sapphires. As the touch panel 10 is configured as an input part of the terminal 1000, the touch panel 10 always suffers contacts, such as impacts or scratches. For example, when the user puts the terminal 1000 into his/her pocket, the touch panel 10 can be scratched and damaged by keys in the pocket of the user.

Therefore, the touch panel 10 can be made of materials having high hardness, for example the above-mentioned sapphires. Certainly, a protecting cover plate can be attached on the upper surface 12 of the touch panel 10, so as to prevent the touch panel 10 from being scratched.

Furthermore, the touch panel 10 includes a display region 15 intended for the user to view the content displayed in the screen 80 and a non-display region 16 for receiving the fingerprint chip package structure 30. In general, a middle region of the touch panel 10 is configured as the display region 15, and the non-display region 16 is arranged at a periphery of the display region 15. For example, the non-display region 16 is located at a top side or a bottom side of the display region 15.

As the touch panel 10 is made of the light-transparent materials, thus, the user can view content displayed in the screen 80 of the terminal 1000 through the display region 15.

For allowing the terminal 1000 to have a better appearance, ink can be sprayed on a lower surface 14 of the non-display region 16. The ink can have a color such as white, black or blue, and so on. A specific color can be set according to actual requirements. The ink can not only satisfy requirements of the user for terminals 1000 having various colors, but also shield structures inside the terminal 1000 so as to reach an effect of beautifying the terminal 1000.

In some embodiments, a shape of the touch panel 10 can be designed specifically according to a shape of the terminal 1000, for example being configured as a rounded rectangle.

Furthermore, the touch panel 10 has a mounting hole 17. In the present embodiment, the mounting hole 17 is configured as a through hole running through the upper surface 12 and the lower surface 14. In other embodiments, the mounting hole 17 can be configured a blind hole formed in the lower surface 14.

In the present embodiment, the mounting hole 17 is configured to have a long circle shape. Certainly, in other embodiments, the mounting hole 17 can have various shapes according to specific requirements, for example a round or oval shape. Therefore, examples of the shape of the mounting hole 17 in the present embodiment cannot be construed to limit the present disclosure.

In some embodiments, the decoration enclosure 20 is fitted in the mounting hole 17 and fixedly coupled to the touch panel 10. The fingerprint chip package structure 30 is accommodated in the decoration enclosure 20 and fixedly coupled to the decoration enclosure 20.

In general, a receiver of the terminal 1000 is disposed in a top region of the terminal 1000. Therefore, for preventing the mounting hole 17 from having an interference with the receiver, in some embodiments, the mounting hole 17 is provided in a bottom region of the touch panel 10, thereby providing a relatively large design space for the mounting hole 17. Furthermore, the mounting hole 17 is provided in the non-display region 16 of the touch panel 10.

In some embodiments, the mounting hole 17 is defined in the middle of the bottom region of the touch panel 10, so that the touch panel 10 presents an approximately symmetrical structure. Thus, the terminal 1000 has a better appearance and is easy to be operated by the user.

When the mounting hole 17 is configured as the through hole, during manufacture of the input assembly 100, the decoration enclosure 20 can be mounted into the mounting hole 17 from underneath of the touch panel 10 firstly, and then an adhesive is dispensed in a gap between an inner wall of the mounting hole 17 and the decoration enclosure 20, so that the decoration enclosure 20 is fixedly coupled to the touch panel 10.

Subsequently, the fingerprint chip package structure 30 is mounted into the decoration enclosure 20 from above of the touch panel 10, and the fingerprint chip package structure 30 is fixedly coupled to the decoration enclosure 20 through the adhesive.

When the mounting hole 17 is configured as the blind hole, the fingerprint chip package structure 30 can be mounted into the decoration enclosure 20 firstly, then the decoration enclosure 20 carried with the fingerprint chip package structure 30 can be mounted into the mounting hole 17, and the adhesive can be used to adhere and fix the decoration enclosure 20 to the touch panel 10.

Figure 3:
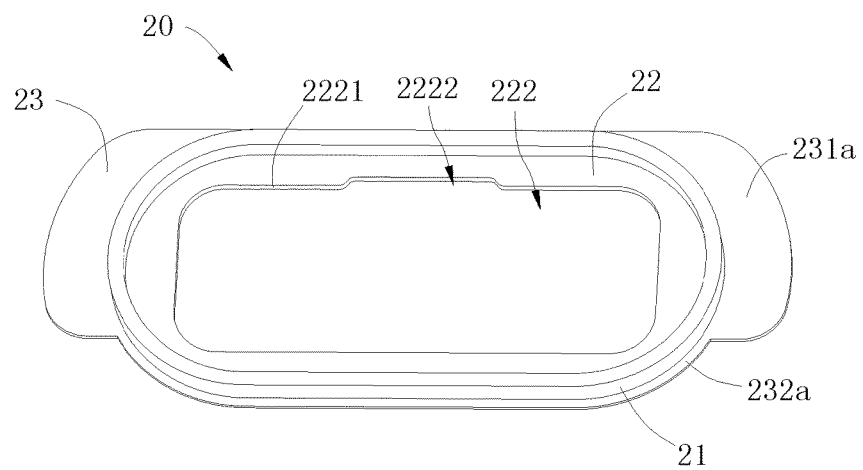
FIG. 3 is an isometric view of a decoration enclosure according to embodiments of the present disclosure.
Figure 4:
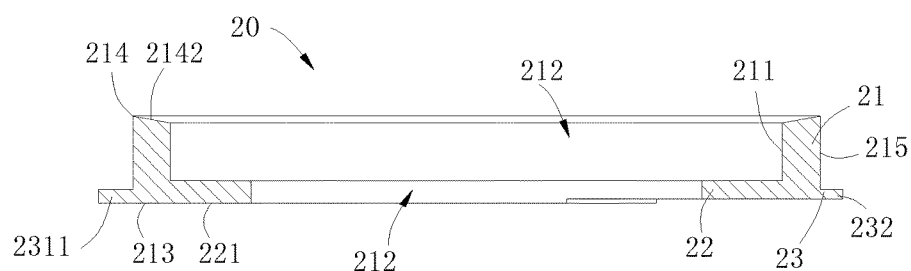
FIG. 4 is a sectional view of a decoration enclosure according to embodiments of the present disclosure.
Figure 5:
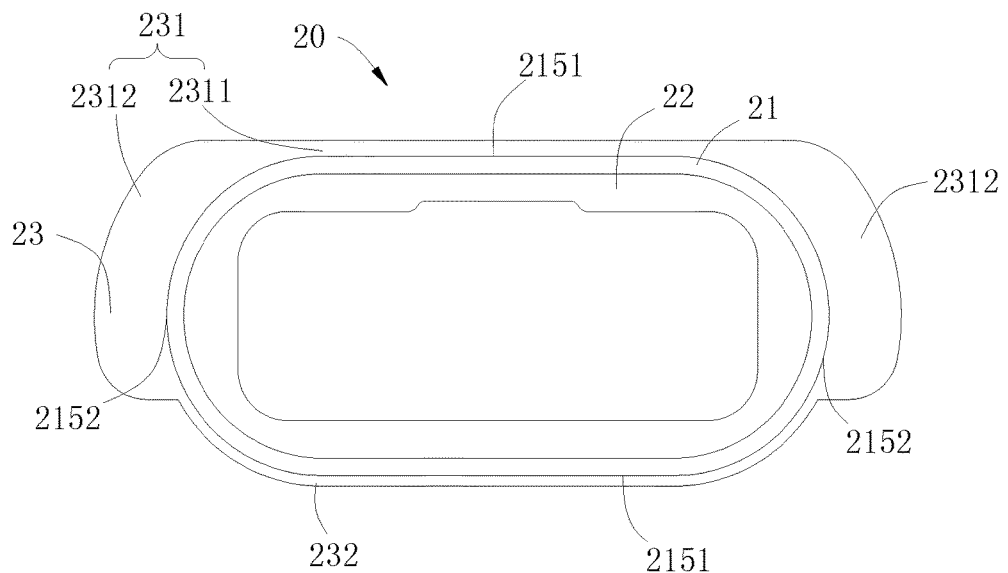
FIG. 5 is a plan view of a decoration enclosure according to embodiments of the present disclosure.

Referring to FIGS. 3-5, in some embodiments, the decoration enclosure 20 includes a decoration ring 21 and a support rim 22. The support rim 22 extends inwards from an inner wall 211 of the decoration ring 21.

The support rim 22 of the decoration enclosure 20 according to embodiments of the present disclosure can support and position the fingerprint chip package structure 30, thereby improving an assembling efficiency of the fingerprint chip package structure 30 and the decoration enclosure 20.

That is to say, the fingerprint chip package structure 30 is supported on the support rim 22. When the fingerprint chip package structure 30 is mounted into the decoration ring 21, the fingerprint chip package structure 30 can be pressed from top to down. If the fingerprint chip package structure 30 cannot be moved any more, it indicates that the fingerprint chip package structure 30 abuts against the support rim 22 and is mounted to a preset location.

In some embodiments, the decoration ring 21 defines an accommodating hole 212 therein, and the support rim 22 is located in the accommodating hole 212. The accommodating hole 212 can be configured to have a straight cylinder shape, or that is to say, the inner wall 211 is configured to be straight, so that the fingerprint chip package structure 30 is easy to be mounted in the accommodating hole 212 rapidly.

The accommodating hole 212 and the support rim 22 can be formed by removing materials from the parts through cutting process, or can be formed by casting.

For ensuring the strength of the decoration enclosure 20, in some embodiments, materials of the decoration enclosure 20 can be metal, for example stainless steel materials, thereby satisfying strength requirements of the decoration enclosure 20 as well as providing a corrosion resistance and improving a service life of the decoration enclosure 20. Certainly, the decoration enclosure 20 can also be made of other materials, such as plastics.

In some embodiments, the support rim 22 is perpendicular to the inner wall 211 of the decoration ring 21.

Thus, the support rim 22 is easy to be formed, thereby reducing a production cost of the decoration ring 21. In addition, when the input assembly 100 is manufactured, the support rim 22 is located in a horizontal position, and the inner wall 211 of the decoration ring 21 is located in a vertical position, so that a surface of the fingerprint chip package structure 30 fitted with the support rim 22 is a horizontal surface, thereby simplifying a structure of the fingerprint chip package structure 30 supported on the support rim 22.

In some embodiments, the decoration ring 21 includes a first bottom surface 213 connected to the inner wall 211, and a lower surface 221 of the support rim 22 is flush with the first bottom surface 213.

Among the decoration rings 21 having a same height, the decoration ring 21 having an arrangement described above has a relatively large accommodating space, so as to ensure that the fingerprint chip package structure 30 can be accommodated in the decoration ring 21.

Or, that is to say, in the case that the fingerprint chip package structure 30 has a constant thickness, a height of the decoration ring 21 is relatively small, thus reducing a height of the input assembly 100, thereby providing a design basis for reducing a thickness of the terminal 1000.

In some embodiments, the decoration ring 21 includes a top wall 214. The top wall 214 is connected to the inner wall 211. The top wall 214 includes a guiding surface 2142 facing towards an interior of the decoration enclosure 20.

In this way, the guiding surface 2142 can guide a finger of the user to enter the decoration ring 21 smoothly, so as to perform fingerprint identification operations, thereby improving an accuracy of the user performing the fingerprint identification operations. Furthermore, the guiding surface 2142 can be coated with a shiny metal layer (such as a chromium layer), so that the decoration ring 21 has a better appearance.

In some embodiments, the guiding surface 2142 can be configured as an annular surface, thereby facilitating the user to place the finger thereof in the decoration ring 21 from respective directions, so as to press the fingerprint chip package structure 30 and perform the fingerprint identification operations.

In some embodiments, the support rim 22 has a hole 222 therein.

Thus, the hole 222 contributes to a routing layout of a flexible fingerprint circuit board 40 coupled to the fingerprint chip package structure 30. For example, the flexible fingerprint circuit board 40 can run through the hole 222 so as to be coupled to the fingerprint chip package structure 30 (as shown in FIG. 2).

In some embodiments, the hole 222 is configured to have a rounded rectangle shape. A side wall 2221 surrounding the hole 222 has a groove 2222 along an axial direction (i.e. a left-right direction shown in FIG. 1) of the hole 222, and the groove 2222 is communicated with the hole 222.

For example, as shown in FIG. 2, after being coupled to the fingerprint chip package structure 30, the flexible fingerprint circuit board 40 firstly extends in a direction towards the groove 2222, then is bent and extends in an opposite direction running away from the groove 2222. Therefore, the groove 2222 can prevent the flexible fingerprint circuit board 40 from producing an interference with the side wall 2221, thereby facilitating wiring of the flexible fingerprint circuit board 40.

In some embodiments, the decoration enclosure 20 includes a flange 23 extending outwards from an outer wall 215 of the decoration ring 21.

Thus, the flange 23 can abut against the lower surface 14 of the touch panel 10, thereby increasing a connecting area between the decoration enclosure 20 and the touch panel 10, and improving the reliability of fixedly connecting the decoration enclosure 20 with the touch panel 10.

In addition, when the decoration enclosure 20 is mounted into the mounting hole 17 from bottom to top, if the flange 23 abuts against the lower surface 14 of the touch panel 10, it indicates that the decoration enclosure 20 is mounted to a preset position. Therefore, the flange 23 is provided to improve the assembling efficiency of the input assembly 100 and to reduce the production cost of the input assembly 100.

In some embodiments, a sealing sheet can be between the flange 23 and the lower surface 14, so as to prevent water from entering the terminal 1000 through a gap between the decoration enclosure 20 and the mounting hole 17, thereby improving a water resistance effect of the terminal 1000.

Figure 6:
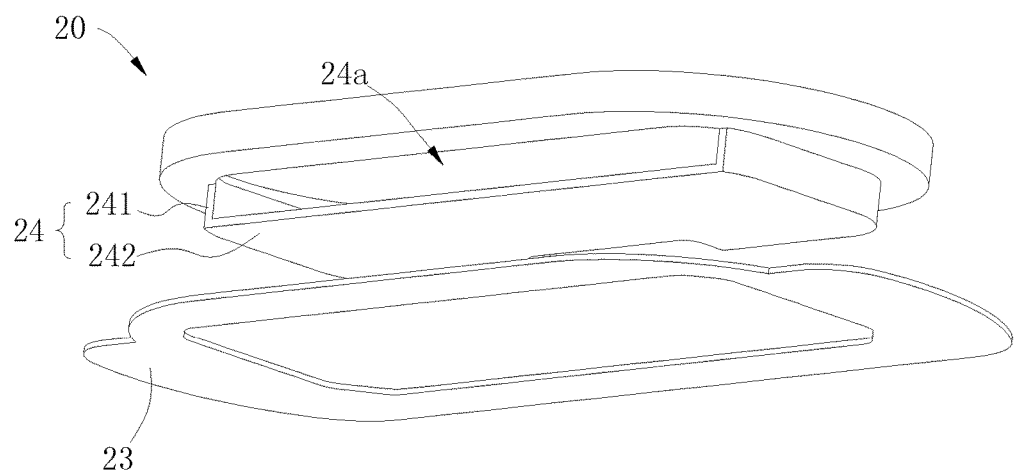
FIG. 6 is an exploded perspective view of a decoration enclosure according to embodiments of the present disclosure.
Figure 7:
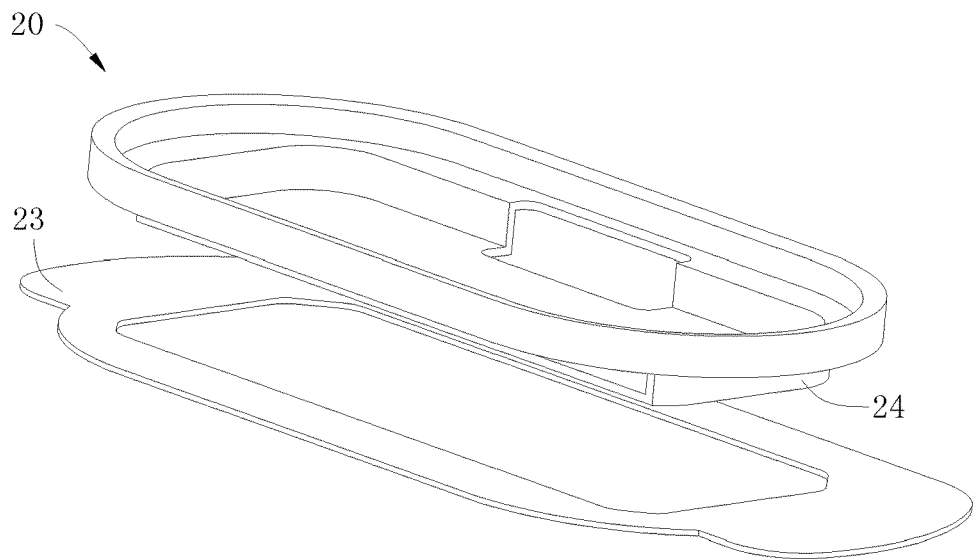
FIG. 7 is another exploded perspective view of a decoration enclosure according to embodiments of the present disclosure.

In embodiments shown in FIGS. 3-5, the flange 23 and the decoration ring 21 are integrally formed. However, in embodiments shown in FIG. 6 and FIG. 7, the flange 23 and the decoration ring 21 are separately formed. In some embodiments, the decoration ring 21 includes a muff-coupling portion 24, and the muff-coupling portion 24 is coupled to the support rim 22. The flange 23 is fitted over the muff-coupling portion 24. Since the flange 23 and the decoration ring 21 are separately formed, production difficulties of the decoration enclosure 20 can be reduced, so that uniformity of each decoration enclosure 20 can be improved when the decoration enclosure 20 is put into mass production.

In some embodiments, the muff-coupling portion 24 can have a through hole 24a through which the flexible fingerprint circuit board 40 can run.

In some embodiments, the muff-coupling portion 24 includes a connecting rim 241 and a bearing plate 242. The connecting rim 241 is coupled to the support rim 22 and the bearing plate 242. The connecting rim 241 is substantially perpendicular to the support rim 22. The bearing plate 242 is substantially perpendicular to the connecting rim 241. The connecting rim 241 has the through hole 24a.

The muff-coupling portion 24 is hollow so as to accommodate a part or a whole of the fingerprint chip package structure 30. In some embodiments, the fingerprint chip package structure 30 can be supported on the bearing plate 242.

Referring to FIGS. 3-5 again, in some embodiments, the flange 23 is perpendicular to the outer wall 215 of the decoration ring 21.

Thus, the manufacturing process of the decoration enclosure 20 is easy, and a contact area of the decoration enclosure 20 and the touch panel 10 can also be improved, in which the contact area is used for connection between the decoration enclosure 20 and the touch panel 10.

In some embodiments, the flange 23 includes a first protrusion 231 and a second protrusion 232 coupled to the first protrusion 231. The first protrusion 231 includes a first portion 2311 and a second portion 2312. The second portion 2312 is coupled to the first portion 2311 and the second protrusion 232. The second portion 2312 protrudes beyond the first portion 2311 and the second protrusion 232, that is, an outer edge of the second portion 2312 has a larger distance from the outer wall 215 of the decoration ring 21 than outer edges of the first portion 2311 and the second protrusion 232.

After the decoration enclosure 20 is mounted in the mounting hole 17, the first portion 2311 and the second protrusion 232 extend along a traverse direction of the touch panel 10 and the second portion 2312 extends along a longitudinal direction of the touch panel 10.

As the non-display region 16 has a relatively large arrangement space in the traverse direction, the second portion 2312 can protrude beyond the first portion 2311 and the second protrusion 232, so as to increase a connecting area of the flange 23 and the touch panel 10.

In addition, widths of the first portion 2311 and the second protrusion 232 are relatively small, thereby avoiding a longitudinal size of the non-display region 16 of the touch panel 10 from being increased due to the widths of the first portion 2311 and the second protrusion 232, such that an area ratio of the display region 15 to the touch panel 10 will not be reduced, and thus the appearance of the terminal 1000 will not be affected.

In some embodiments, a top surface 231a of the first protrusion 231 is flush with a top surface 232a of the second protrusion 232, and a thickness of the first portion 2311 is larger than a thickness of the second protrusion 232.

In some embodiments, when the decoration enclosure 20 is mounted in the mounting hole 17, the second protrusion 232 is closer to the display region 15, compared to the first portion 2311. Or, that is to say, the first portion 2311 is away from the display region 15, and the second protrusion 232 is close to the display region 15.

As there are more parts in a portion of the input assembly 100 close to the display region 15, the second protrusion 232 will not have an interference with other parts close to the display region 15 due to the small thickness of the second protrusion 232 (as shown in FIG. 2).

As shown in FIG. 2, an orthographic projection of the decoration enclosure 20 in the lower surface 14 of the touch panel 10 overlaps orthographic projections of a flexible screen circuit board 50 coupled to the screen 80 of the terminal 1000 and of other parts in the lower surface 14 of the touch panel 10, as indicated by a region limited between two dotted lines in FIG. 2, while the second protrusion 232 will not have an interference with the flexible screen circuit board 50 and the other parts due to the small thickness of the second protrusion 232, so that the decoration enclosure 20 can be closer to the display region 15 and even can be partially or entirely in the display region 15 of the touch panel 10, thus reducing an area ratio of the non-display region 16 to the touch panel 10 and improving the area ratio of the display region 15 to the touch panel 10.

In some embodiments, the orthographic projection of the decoration enclosure 20 in the lower surface 14 of the touch panel 10 may completely overlap the orthographic projection of the flexible screen circuit board 50 in the lower surface 14 of the touch panel 10, but the present disclosure is not limited to this. For example, in other embodiments, the orthographic projection of the decoration enclosure 20 in the lower surface 14 of the touch panel 10 may partially overlap the orthographic projection of the flexible screen circuit board 50 in the lower surface 14 of the touch panel 10.

In some embodiments, the decoration ring 21 is configured to have a long circle shape. The outer wall 215 of the decoration ring 21 includes two straight segments 2151 in parallel and two curved segments 2152 each coupled to the two straight segments 2151. The first portion 2311 is provided to one of the two straight segments 2151, and the second portion 2312 is provided to each curved segment 2152. As shown in FIG. 5, two second portions 2312 are provided, and the two second portions 2312 are provided to the two curved segments 2152 respectively.

Thus, the decoration ring 21 has the better appearance. In some embodiments, the two curved segments 2152 are arrayed in two lines along the traverse direction (for example the left-right direction shown in FIG. 1) of the touch panel 10, and the two straight segments 2151 are arrayed in two lines along the longitudinal direction (perpendicular to the traverse direction) of the touch panel 10.

In some embodiments, a shape of the second portion 2312 is matched with a shape of the curved segment 2152.

For example, an outer contour of the second portion 2312 also has an arc shape, and the second portion 2312 and the curved segment 2152 are substantially concentrically arranged, so that the decoration enclosure 20 has a more compact structure.

Figure 8:
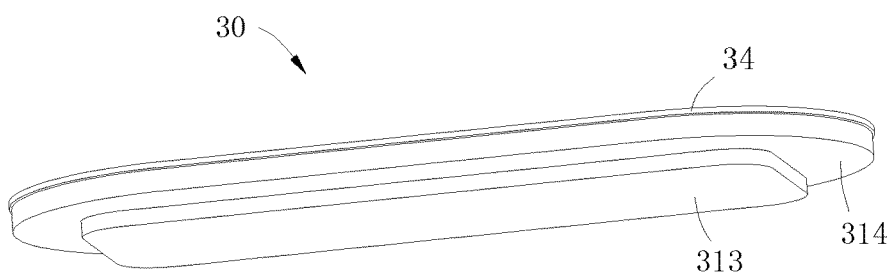
FIG. 8 is a perspective view of a fingerprint chip package structure according to embodiments of the present disclosure.
Figure 9:
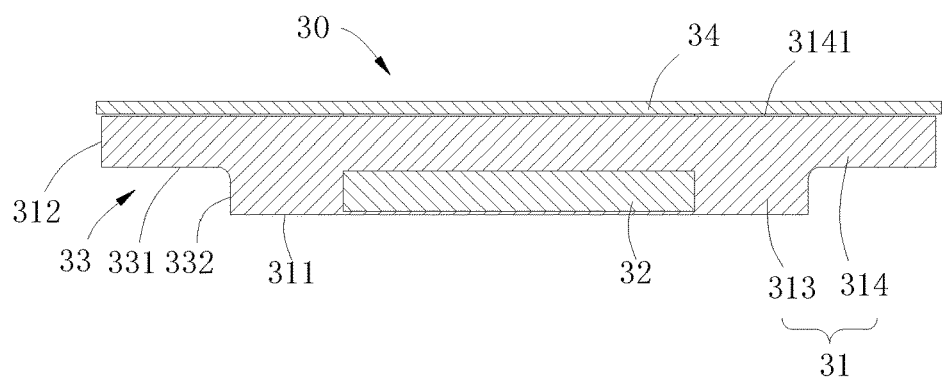
FIG. 9 is a sectional view of a fingerprint chip package structure according to embodiments of the present disclosure.
Figure 10:
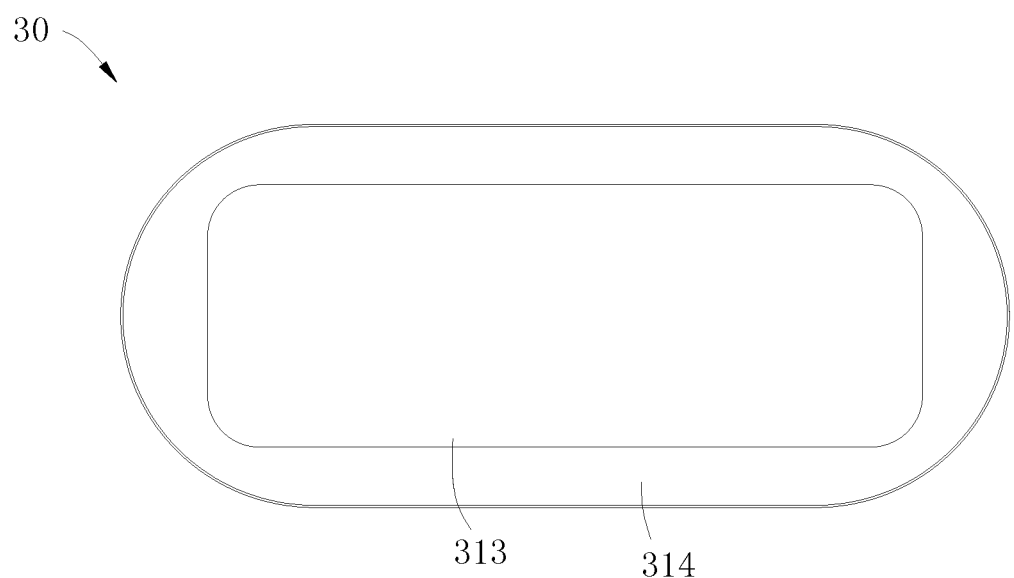
FIG. 10 is a plan view of a fingerprint chip package structure according to embodiments of the present disclosure.

Referring to FIG. 8-FIG. 10, in some embodiments, the fingerprint chip package structure 30 includes a package body 31 and a fingerprint identification chip 32.

The package body 31 includes a second bottom surface 311 and a lateral surface 312 connected to the second bottom surface 311, and a recessed portion 33 is formed at a junction of the second bottom surface 311 and the lateral surface 312. The fingerprint identification chip 32 is received in the package body 31.

In the fingerprint chip package structure 30 according to embodiments of the present disclosure, the recessed portion 33 can be fitted with the support rim 22 of the decoration enclosure 20, thereby positioning the fingerprint chip package structure 30, and further improving the assembling efficiency of the fingerprint chip package structure 30.

In addition, since the recessed portion 33 is fitted with the support rim 22, a thickness of the fingerprint chip package structure 30 can be reduced, thus facilitating miniaturization of the terminal 1000 to which the fingerprint chip package structure 30 is applied.

In some embodiments, when the user performs an operation to unlock the terminal 1000 via a fingerprint, the finger can be put in a position corresponding to the fingerprint identification chip 32. A signal of the fingerprint identification chip 32 is transmitted through the package body 31 so as to collect and identify a fingerprint pattern of the user, and then the fingerprint pattern of the user is matched with a prestored fingerprint pattern. If the matching is successful, the terminal 1000 is unlocked.

In some embodiments, a surface of the fingerprint identification chip 32 facing towards the finger of the user is provided with a sensing pixel array, so as to collect the fingerprint pattern of the user. The package body 31 packages the fingerprint identification chip 32, so as to reduce influences of other interference signals on the sensing pixel array when the sensing pixel array collects the fingerprint pattern, thus improving an accuracy of the identification.

In some embodiments, the recessed portion 33 is configured to be fitted with the support rim 22, that is to say, the support rim 22 is configured to be accommodated in the recessed portion 33, so that the fingerprint chip package structure 30 is supported on the support rim 22 through the recessed portion 33.

In the present embodiment, the recessed portion 33 is configured to be annular. Correspondingly, the support rim 22 also is configured to be annular, so that the recessed portion 33 can accommodate the support rim 22.

In other embodiments, a plurality of recessed portions 33 spaced apart from one another along a circumferential direction of the junction of the second bottom surface 311 and the lateral surface 312 can be provided, and correspondingly, a plurality of support rims 22 spaced apart from one another along the circumferential direction can be also provided. The plurality of recessed portions 33 are fitted with the plurality of support rims 22 correspondingly.

For example, three recessed portions 33 can be provided, and two adjacent recessed portions 33 are spaced apart from each other by 120° along the circumferential direction. Three support rims 22 can also be provided, and the three support rims 22 are corresponding to the three recessed portions 33 with respect to the structural position.

In some embodiments, the shape and the number of the recessed portion 33 are not limited to the above-discussed cases, as long as the recessed portion 33 is fitted with the support rim 22, so that the support rim 22 can support the fingerprint chip package structure 30. Therefore, the above-mentioned examples cannot be construed to limit the present disclosure.

Certainly, in some embodiments, when the thickness of the fingerprint chip package structure 30 is relatively small, the recessed portion 33 can be omitted from the fingerprint chip package structure 30.

In some embodiments, the package body 31 includes a first package portion 313 and a second package portion 314 coupled to the first package portion 313. The first package portion 313 includes the second bottom surface 311, and the second package portion 314 includes the lateral surface 312.

Thus, the recessed portion 33 can be defined by the first package portion 313 and the second package portion 314. For example, the package body 31 can be provided with the recessed portion 33 by cutting off materials from the package body 31, i.e. via the cutting process, or the recessed portion 33 can also be directly formed together with the package body 31 by casting.

In some embodiments, for forming the recessed portion 33, a cross-section area of the first package portion 313 is smaller than a cross-section area of the second package portion 314.

In some embodiments, the first package portion 313 is received in the hole 222, and the second package portion 314 is supported on the support rim 22.

In some embodiments, the fingerprint identification chip 32 is received in the first package portion 313.

Thus, a circuit junction of the fingerprint identification chip 32 is easy to be exposed, so as to be coupled to the flexible fingerprint circuit board 40.

In some embodiments, a shape and a size of the first package portion 313 are matched with a shape and a size of the fingerprint identification chip 32.

Or, that is to say, the shape of the fingerprint identification chip 32 is similar to or same with the shape of the first package portion 313. For example, the fingerprint identification chip 32 is configured to have a cuboid shape and the first package portion 313 is configured to have a cuboid or a rounded cuboid shape.

The size of the first package portion 313 is slightly larger than the size of the fingerprint identification chip 32, so as to achieve an effect of packaging the fingerprint identification chip 32. Thus, the fingerprint chip package structure 30 has the more compact structure.

In some embodiments, the first package portion 313 has the rounded cuboid shape.

Thus, the package body 31 can be better fitted with the fingerprint identification chip 32. Furthermore, the shape of the first package portion 313 is matched with a shape of the hole 222, that is to say, the hole 222 also has the rounded cuboid shape.

In some embodiments, the second package portion 314 includes a top surface 3141 connected to the lateral surface 312. The fingerprint chip package structure 30 includes a cover plate 34 fixed on the top surface 3141 of the second package portion 314. For example, the cover plate 34 can be fixed on the top surface 3141 of the second package portion 314 through adhesive.

When the user performs the fingerprint identification operation, the finger can press on the cover plate 34. The cover plate 34 can protect the package body 31 from being damaged, so as to improve the reliability of the fingerprint chip package structure 30.

As the cover plate 34 suffers touches frequently, the cover plate 34 can be made of materials having high hardness, for example the sapphires materials mentioned above.

In some embodiments, a shape and a size of the cover plate 34 are matched with a shape and a size of the top surface 3141 of the second package portion 314.

For example, the top surface 3141 is configured to have a long circle shape, and the cover plate 34 is also configured to have a long circle shape. An area of the cover plate 34 is slightly larger than an area of the top surface 3141 of the second package portion 314. Thus, the cover plate 34 can cover the second package portion 314 entirely.

In some embodiments, a sealing member 60 is between the second package portion 314 and the support rim 22. The sealing member 60 is configured to seal a gap between the second package portion 314 and the support rim 22. For example, the sealing member 60 is made of silica gel (as shown in FIG. 2).

Thus, the sealing member 60 can prevent foreign matters (such as water and dust) from entering the terminal 1000 from a gap between the fingerprint chip package structure 30 and the decoration enclosure 20, thereby improving the waterproof and dustproof effects of the terminal 1000.

In some embodiments, the recessed portion 33 includes a first surface 331 and a second surface 332 connected to the first surface 331, and the first surface 331 is perpendicular to the second surface 332.

Thus, the recessed portion 33 is easy to be formed, and the first surface 331 is easy to be connected to the support rim 22. The first surface 331 is perpendicular to the second surface 332, so that the package body 31 is configured to have a stepped shape.

In some embodiments, the sealing member 60 is between the first surface 331 and the support rim 22.

In some embodiments, a junction of the first surface 331 and the second surface 332 is configured to be a transition fillet.

Thus, defects (such as cracks) are not easy to occur at the junction of the first surface 331 and the second surface 332 and the recessed portion 33 is easy to be formed.

Reference throughout this specification to "an embodiment", "some embodiments", "one embodiment", "another example", "an example", "a specific example" or "some examples" means that a particular feature, structure, material, or characteristic described in connection with the embodiment or example is included in at least one embodiment or example of the present disclosure. Thus, the appearances of the phrases such as "in some embodiments", "in one embodiment", "in an embodiment", "in another example", "in an example", "in a specific example" or "in some examples" in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A fingerprint chip package structure, comprising:
a package body having a bottom surface and a lateral surface connected to the bottom surface, wherein the package body defines a recessed portion at a junction of the bottom surface and the lateral surface; and
a fingerprint identification chip received in the package body, wherein the package body packages the fingerprint identification chip therein,
wherein the package body comprises a first package portion and a second package portion coupled to the first package portion, the first package portion comprises the bottom surface, and the second package portion comprises the lateral surface,
wherein the fingerprint chip package structure is configured to be received in a decoration enclosure, the decoration enclosure comprises a decoration ring and a support rim extending inwards from an inner wall of the decoration ring, the support rim is received in the recessed portion, the support rim has a hole therein, the first package portion passes through the hole in the support rim, and the second package portion is supported on the support rim,
wherein the second package portion comprises a top surface connected to the lateral surface, and the fingerprint chip package structure comprises a cover plate fixed on the top surface.

2. The fingerprint chip package structure according to claim 1, wherein the fingerprint identification chip is received in the first package portion.

3. The fingerprint chip package structure according to claim 2, wherein a shape and a size of the first package portion are matched with a shape and a size of the fingerprint identification chip.

4. The fingerprint chip package structure according to claim 1, wherein the first package portion has a rounded cuboid shape.

5. The fingerprint chip package structure according to claim 1, wherein the cover plate is fixed on the top surface through an adhesive.

6. The fingerprint chip package structure according to claim 1, wherein a shape and a size of the cover plate are matched with a shape and a size of the top surface.

7. The fingerprint chip package structure according to claim 1, wherein the recessed portion comprises a first surface and a second surface connected to the first surface, and the first surface is perpendicular to the second surface.

8. The fingerprint chip package structure according to claim 7, wherein the recessed portion has a transition fillet at a junction of the first surface and the second surface.

9. The fingerprint chip package structure according to claim 1, wherein the recessed portion comprises a first surface and a second surface connected to the first surface, and the first surface is perpendicular to the second surface.

10. The fingerprint chip package structure according to claim 9, wherein the recessed portion has a transition fillet at a junction of the first surface and the second surface.

11. A terminal, comprising a fingerprint chip package structure, wherein the fingerprint chip package structure comprises:
a package body having a bottom surface and a lateral surface connected to the bottom surface, wherein the package body defines a recessed portion at a junction of the bottom surface and the lateral surface; and
a fingerprint identification chip received in the package body, wherein the package body packages the fingerprint identification chip therein, wherein the package body comprises a first package portion and a second package portion coupled to the first package portion, the first package portion comprises the bottom surface, and the second package portion comprises the lateral surface, wherein the fingerprint chip package structure is configured to be received in a decoration enclosure, the decoration enclosure comprises a decoration ring and a support rim extending inwards from an inner wall of the decoration ring, the support rim is received in the recessed portion, the support rim has a hole therein, the first package portion passes through the hole in the support rim, and the second package portion is supported on the support rim, wherein the second package portion comprises a top surface connected to the lateral surface, and the fingerprint chip package structure comprises a cover plate fixed on the top surface.

12. The terminal according to claim 11, wherein the fingerprint identification chip is received in the first package portion.

13. The terminal according to claim 12, wherein a shape and a size of the first package portion are matched with a shape and a size of the fingerprint identification chip.

14. The terminal according to claim 11, wherein the first package portion has a rounded cuboid shape.

15. The terminal according to claim 11, wherein the cover plate is fixed on the top surface through an adhesive.

16. The terminal according to claim 11, wherein a shape and a size of the cover plate are matched with a shape and a size of the top surface.

17. The terminal according to claim 11, wherein the recessed portion comprises a first surface and a second surface connected to the first surface, and the first surface is perpendicular to the second surface.

18. The terminal according to claim 17, wherein the recessed portion has a transition fillet at a junction of the first surface and the second surface.

* * * * *